United States Patent
Celik et al.

(10) Patent No.: US 11,828,801 B2
(45) Date of Patent: Nov. 28, 2023

(54) SYSTEM AND METHOD OF OVER-THE-AIR TESTING OF A DEVICE UNDER TEST

(71) Applicant: Rohde & Schwarz GmbH & Co. KG, Munich (DE)

(72) Inventors: Mert Celik, Munich (DE); Hendrik Bartko, Munich (DE); Benoit Derat, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/706,340

(22) Filed: Mar. 28, 2022

(65) Prior Publication Data

US 2023/0305056 A1    Sep. 28, 2023

(51) Int. Cl.
*G01R 27/28* (2006.01)
*G01R 31/302* (2006.01)
*G01R 31/317* (2006.01)
*G01R 31/319* (2006.01)

(52) U.S. Cl.
CPC ... *G01R 31/3025* (2013.01); *G01R 31/31713* (2013.01); *G01R 31/31908* (2013.01); *G01R 31/31917* (2013.01)

(58) Field of Classification Search
CPC .. G01R 29/10; G01R 29/105; G01R 29/0814; G01R 29/0821; G01R 29/0878; G01R 29/0892; G01R 29/0871; G01R 31/3025; G01R 31/31713; G01R 31/31908; G01R 31/31917; G01R 31/001; G01R 1/0018
See application file for complete search history.

(56) References Cited

U.S. PATENT DOCUMENTS

| | | | |
|---|---|---|---|
| 10,374,728 B1* | 8/2019 | Derat | H04B 17/19 |
| 2017/0094626 A1* | 3/2017 | Bartko | G01S 3/023 |
| 2017/0279544 A1* | 9/2017 | Noda | H04B 17/318 |
| 2020/0209296 A1* | 7/2020 | Kong | H04B 7/0695 |
| 2022/0006536 A1* | 1/2022 | Feng | H01Q 3/267 |

* cited by examiner

*Primary Examiner* — Thang X Le
(74) *Attorney, Agent, or Firm* — CHRISTENSEN O'CONNOR JOHNSON KINDNESS PLLC (57) ABSTRACT

A system for over-the-air testing of a device under test includes a measurement antenna, a reference antenna, a device under test capable of wirelessly transmitting and/or receiving complex radio frequency signals, and an analyzer. The analyzer has at least two ports, wherein the reference antenna is connected with a first port of the analyzer. The measurement antenna is connected with a second port of the analyzer. The analyzer is capable of determining a phase difference and a power ratio of radio frequency signals received via the measurement antenna and the reference antenna. The analyzer is capable of performing an IQ analysis on complex radio frequency signals. Further, a method of over-the-air testing of a device under test is disclosed.

20 Claims, 3 Drawing Sheets

SYSTEM AND METHOD OF OVER-THE-AIR TESTING OF A DEVICE UNDER TEST

FIELD OF THE DISCLOSURE

Embodiments of the present disclosure relate to a system for over-the-air (OTA) testing of a device under test. Further, embodiments of the present disclosure also relate to a method of over-the-air (OTA) testing of a device under test.

BACKGROUND

Modern communication devices become more and more complex. Accordingly, testing their respective characteristics is also becoming more complicated. For instance, complex network analyses of active communication devices, e.g. those generating their own signals and/or having inaccessible ports, are necessary in order to characterize the respective devices in an appropriate manner In other words, complex measurements in network analysis are performed for characterizing the respective communication device.

So far, multiple coherent receivers, for instance two or more coherent spectrum analyzers, were necessary in order to perform complex network analyses of those communication devices. Accordingly, the respective costs are high since two or more receivers have to be provided and, additionally, the coherency of these receivers have to be obtained which is also challenging. It is, inter alia, necessary to perform a calibration in order to compensate for systematic error introduced by cables used for interconnecting purposes. In case of a 4-port complex network analysis, four receivers, e.g. spectrum analyzers, are required which have to be kept in coherency.

Besides these complex network analyses, it is also known in the state of the art to perform a regular network analysis by a vector network analyzer (VNA) which provides a continuous wave (CW) signal that is forwarded to the communication device for testing purposes, namely the device under test. The vector network analyzer receives a resultant continuous wave signal from the device under test, which is analyzed in order to determine respective characteristics of the device under test.

As already described above, modern communication devices typically generate their own signals such that it is not possible to inject a vector network analyzer signal for analyzing purposes. Further, these communication devices typically do not have accessible input and/or output ports that can be connected easily with ports of the vector network analyzer for testing purposes.

Accordingly, there is a need for performing complex network analysis of active communication devices, particularly those that generate their own signal and/or have no accessible input/output ports in a simple and efficient manner

SUMMARY

Embodiments of the present disclosure provide a system for over-the-air testing of a device under test. In an embodiment, the system comprises a measurement antenna, a reference antenna, a device under test capable of wirelessly transmitting and/or receiving complex radio frequency signals, and an analyzer. The analyzer has at least two ports, wherein the reference antenna is connected with a first port of the analyzer, and wherein the measurement antenna is connected with at least a second port of the analyzer. The analyzer includes, for example, circuitry (e.g., one or more circuits) configured (e.g., programmed) for determining a phase difference and a power ratio of radio frequency signals received via the measurement antenna and the reference antenna. Further, the analyzer includes, for example, circuitry (e.g., one or more circuits) configured for performing an IQ (in-phase and quadrature) analysis on complex radio frequency signals.

Accordingly, a device under test, for instance a base station or a mobile device like a mobile phone, which has a non-accessible antenna can be tested in a wireless manner by the system appropriately. The respective device under test may communicate by complex radio frequency (RF) signals like 5G New Radio (NR) signals, for example RF signals in frequency bands like frequency range 1 (FR1) and/or frequency range 2 (FR2). The respective antennas connected with the analyzer, namely the measurement antenna and the reference antenna, also called coupling antenna, both are used for receiving signals emitted by the device under test, wherein the respective complex radio frequency signals received are forwarded to the analyzer for analyzing purposes. The analyzer, via its one or more circuits, for example, is enabled to determine a phase difference and a power ratio between the respective complex radio frequency signals received via the different antennas. Hence, it is clear that the analyzer is not only used for continuous wave (CW) signals like it was in the past when using a vector network analyzer.

The respective analyzer may comprise several receivers that are used in a parallel manner for processing the radio frequency signals obtained from the respective antennas, namely the reference antenna and the measurement antenna.

Further, the analyzer comprises at least one local oscillator that is associated with the receivers. In some embodiments, the at least one local oscillator provides a local oscillator signal that is used by the respective receivers of the analyzer. The respective phase of the local oscillator signal(s) may be set, for example in an arbitrary manner Put differently, the analyzer can generate arbitrary local oscillator frequencies coherently. Hence, there is a possibility to do phase coherent measurements.

The respective receivers may each have an analog-to-digital converter (ADC) that processes the radio frequency signal received in order to obtain digitized samples. Thus, the receivers provide coherent digitized samples.

Accordingly, the analyzer having the respective receivers may be used as an IQ analyzer. In other words, the receivers may correspond to IQ samplers.

In general, the bandwidth is substantially unlimited, as several measurements are performed in a subsequent manner by changing the local oscillator signal step by step until the bandwidth of the device under test is covered in its entirety.

Since the system comprises the reference antenna and the measurement antenna, both antennas may receive and/or transmit radio frequency signals that are used for determining the characteristics of the device under test. For instance, the reference antenna is used for providing a reference signal, whereas the measurement antenna is used for gathering a measurement signal, e.g. measuring purposes. Thus, the measurement antenna may be moved with respect to the device under test, for instance on a sphere.

An aspect provides that the analyzer is capable of, for example, performing a coherent IQ analysis. The complex radio frequency signals are internally processed by the analyzer in a coherent manner As indicated above, the analyzer comprises the at least one local oscillator that provides the at least one local oscillator signal for the receivers, thereby ensuring coherent operation of the receivers.

Another aspect provides that the analyzer is capable of (e.g., includes circuitry configured for) determining the phase difference and the power ratio based on the coherent IQ analysis. The respective calculation of the phase difference and/or the power ratio may be done in a typical way based on IQ data obtained when performing the IQ analysis, e.g. techniques known in the state of the art (IQ-techniques). For instance, the phase difference (Φ) can be determined based on the arc tangent of the respective IQ data, namely $$\Phi = \arctan\frac{Q}{I},$$

or the power ratio (A) may be determined by the square root of the sum of squares of the respective IQ data, namely $A=\sqrt{I^2+Q^2}$.

According to another aspect, the system is capable of (e.g., includes circuitry configured for) splitting a radio frequency reference signal outputted by the reference antenna into a first reference signal and a second reference signal which are 90° phase shifted with respect to each other, wherein the analyzer is capable of processing the first reference signal and the second reference signal. Accordingly, the single radio frequency reference signal provided by the reference antenna is split into two signals that are phase shifted with respect to each other for further processing, wherein this ensures that the analyzer can perform the IQ analysis. The respective 90° phase shift may be introduced when splitting the radio frequency reference signal that is outputted by the reference antenna.

In some embodiments, the analyzer is capable of (e.g., includes circuitry configured for) combining the first reference signal and the second reference signal in intermediate frequency (IF) section, thereby obtaining a complex reference signal. The complex reference signal encompasses data corresponding to IQ data. Accordingly, the analyzer is enabled to internally process the reference signals obtained, which are phase shifted with respect to each other.

Another aspect provides that the analyzer is capable of (e.g., includes circuitry configured for) performing a Fourier transformation of the complex reference signal. The Fourier transform obtained, namely the Fourier transform of the complex reference signal, can be used for further processing.

According to a particular embodiment, the system comprises a hybrid coupler that is capable of splitting the radio frequency reference signal outputted by the reference antenna into the first reference signal and the second reference signal. They hybrid coupler also directly introduces the 90° phase shift such that the phase shifted reference signals are obtained.

In some embodiments, the hybrid coupler may be an integrated part of the analyzer. Alternatively, the hybrid coupler may be a separately formed part that is interconnected between the reference antenna and the analyzer.

According to another aspect, the system is capable of (e.g., includes circuitry configured for) splitting a radio frequency measurement signal outputted by the measurement antenna into a first measurement signal and a second measurement signal which are 90° phase shifted with respect to each other, wherein the analyzer is capable of (e.g., includes circuitry configured for) processing the first measurement signal and the second measurement signal. Accordingly, the single radio frequency measurement signal provided by the measurement antenna is split into two signals that are phase shifted with respect to each other for further processing, wherein this ensures that the analyzer can perform the IQ analysis. The respective 90° phase shift may be introduced when splitting the radio frequency measurement signal that is outputted by the measurement antenna.

In some embodiments, the analyzer is capable of (e.g., includes circuitry configured for) combining the first measurement signal and the second measurement signal in intermediate frequency (IF) section, thereby obtaining a complex measurement signal. The complex measurement signal encompasses data corresponding to IQ data. Accordingly, the analyzer is enabled to internally process the measurement signals obtained, which are phase shifted with respect to each other.

Another aspect provides that the analyzer is capable of (e.g., includes circuitry configured for) performing a Fourier transformation of the complex measurement signal. The Fourier transform obtained, namely the Fourier transform of the complex measurement signal, can be used for further processing.

According to a particular embodiment, the system comprises a hybrid coupler that is capable of splitting the radio frequency measurement signal outputted by the measurement antenna into the first measurement signal and the second measurement signal. They hybrid coupler also directly introduces the 90° phase shift such that the phase shifted measurement signals are obtained.

In some embodiments, the hybrid coupler may be an integrated part of the analyzer. Alternatively, the hybrid coupler may be a separately formed part that is interconnected between the measurement antenna and the analyzer.

In general, the analyzer is capable of (e.g., includes circuitry configured for) obtaining a complex reference signal and a complex measurement signal based on the radio frequency signals received via the measurement antenna and the reference antenna respectively. Further, Fourier transformations are performed of the complex reference signal and the complex measurement signal respectively, wherein the analyzer is capable of (e.g., includes circuitry configured for) dividing resultants of the respective Fourier transformations, thereby obtaining a quotient of the resultants of the Fourier transformations. Accordingly, the analyzer is enabled to process complex signals that are received or rather internally generated by the analyzer itself. In any case, the internal processing of the complex signals includes performing Fourier transformations in order to obtain Fourier transforms (resultants of the respective Fourier transformations), which can be further processed in order to gather deeper insights or rather further information of the device under test. The further processing includes dividing the respective resultants in order to obtain the quotient of the Fourier transforms.

The respective complex signals, e.g. the ones obtained or rather internally generated, may be digitized, namely processed by analog-to-digital converter(s) of the analyzer. Hence, digitized complex signals may be obtained. The digitized complex signals may be processed further by applying a respective Fourier transformation.

In some embodiments, the quotient corresponds to a complex transfer function between the radio frequency signal received via the reference antenna and the radio frequency signal received via the measurement antenna, namely the respective complex radio frequency signals received via the respective antennas that are connected via the output ports with the analyzer. In other words, the complex transfer function between the device under test and the measurement antenna may be derived from the quotient when correlating the radio frequency reference signal and the radio frequency measurement signal, as the reference antenna has a fixed relationship to the device under test.

For instance, the measurement antenna is a dual-polarized measurement antenna having two output ports. The dual-polarized measurement antenna may output a horizontally polarized signal portion as well as a vertically polarized signal portion which can be processed independently of each other by the analyzer.

The analyzer may have at least three ports, wherein the dual-polarized measurement antenna is connected via its two output ports with the second port and a third port of the analyzer. Thus, the horizontally-polarized signal portion and the vertically-polarized signal portion associated with the complex measurement signal can be forwarded to the analyzer for further processing.

Another aspect provides that the reference antenna is positioned in a fixed relationship to the device under test. For instance, the reference antenna is fixedly connected to the device under test or to a holder that holds the device under test. Accordingly, the reference antenna is located in a fixed relationship, thereby ensuring that the reference antenna provides information of the device under test in a defined manner due to the defined and fixed relationship between the reference antenna and the device under test. In some embodiments, the reference antenna is located in proximity of the device under test.

Further, the system may comprise a positioner for relative positioning of the measurement antenna and the device under test with respect to each other. The positioner may be capable of positioning either the measurement antenna relative to the device under test or the device under test relative to the measurement antenna. This means that either the measurement antenna or the device under test may be movable, whereas the other component or the system maintains its respective position. Alternatively, the positioner may be capable of moving the measurement antenna and the device under test simultaneously, thereby providing a relative movement of the device under test and the measurement antenna with respect to each other accordingly. The positioner can include, for example, one or more linear and/or rotational stages.

Furthermore, the ports of the analyzer are associated with two receivers. Thus, a complex radio frequency signal inputted at one of the respective ports can be internally processed by two receivers.

In some embodiments, an internally integrated hybrid coupler splits the respective radio frequency signal into the respective radio frequency signals to be combined later in order to obtain the complex signals.

Generally, the respective analyzer is free of an IQ mixer. Accordingly, the IQ analysis can be done by the analyzer even though the analyzer itself is free of IQ mixer, which means that the respective analyzer does not have an internal IQ mixer that is used for processing the radio frequency signal received by the respective port of the analyzer.

According to a further aspect, the analyzer is a vector network analyzer or a broad-band direction finder. Typically, the vector network analyzer or rather the broad-band direction finder does not comprise an IQ mixer.

Embodiments of the present disclosure also provide a method of over-the-air testing of a device under test. In an embodiment, the method comprises providing a device under test; receiving a radio frequency signal of the device under test by a measurement antenna that outputs a radio frequency measurement signal; receiving a radio frequency signal of the device under test by a reference antenna that outputs a radio frequency reference signal; forwarding the radio frequency measurement signal and the radio frequency reference signal to an analyzer; processing the radio frequency measurement signal and the radio frequency reference signal by the analyzer, thereby obtaining a complex reference signal and a complex measurement signal based on the radio frequency signals received; performing a Fourier transformation of the complex reference signal and a Fourier transformation of the complex measurement signal, thereby obtaining resultants of the respective Fourier transformations, and dividing the resultants of the respective Fourier transformations, thereby obtaining a quotient of the resultants of the Fourier transformations.

Further aspects and advantages of the respective method are described above with respect to the system.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
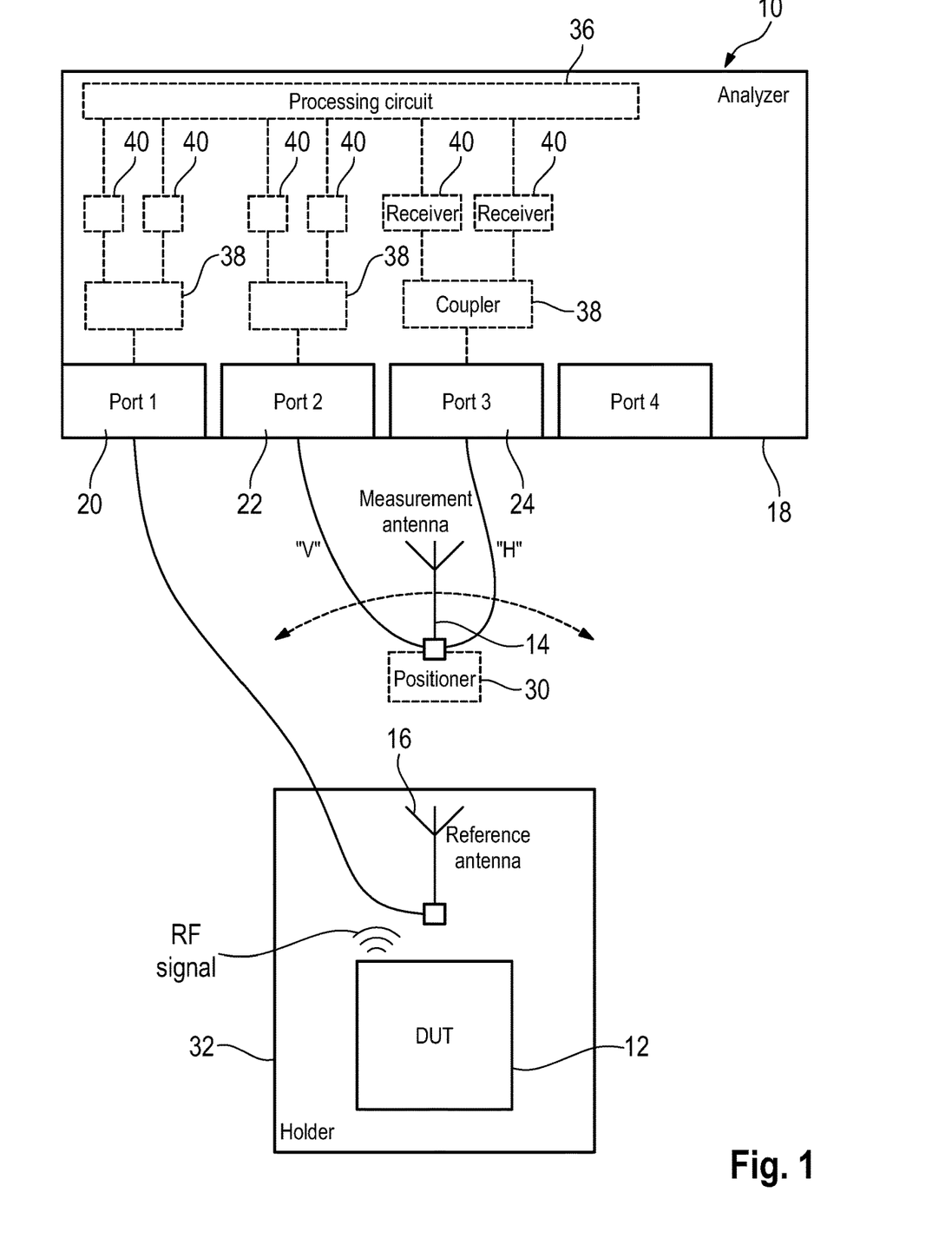
FIG. 1 schematically shows an overview of a system according to an embodiment of the present disclosure.

In FIG. 1, a system 10 for over-the-air testing of a device under test 12 is shown. The device under test 12 corresponds to a base station or a mobile device, such as a mobile phone, which is generally configured to transmit and/or receive complex radio frequency signals like 5G New Radio (NR) signals, e.g. radio frequency signals in the frequency band associated with frequency range 1 (FR1) and/or frequency range 2 (FR2).

The system 10 comprises a measurement antenna 14 as well as a reference antenna 16 which both are connected with an analyzer 18 that is part of the system 10. In the shown embodiment, the analyzer 18 has three input ports 20, 22, 24 which are used for connecting the respective antennas 14, 16.

The reference antenna 16 is connected with the first port 20 of the analyzer 18. The measurement antenna 14 is a dual-polarized measurement antenna that has two output ports 26, 28 via which the measurement antenna 14 is connected with the second port 22 and the third input port 24 of the analyzer 18.

The system 10 further comprises a positioner 30 that is used for positioning the measurement antenna 14 and the device under test 12 with respect to each other. The positioner 30 may move the measurement antenna 14 with respect to the device under test 12 that is maintained at a fixed position, for instance by a holder 32 that holds the device under test 12, as shown in FIG. 1. Alternatively, the positioner 30 may move the device under test 12 with respect to the measurement antenna 14 that is maintained at a fixed position. According to another alternative embodiment, the positioner 30 may move the measurement antenna 14 and the device under test 12 simultaneously, thereby also providing a relative positioning of the measurement antenna 14 and the device under test 12 with respect to each other. In some embodiments, the positioner may include, for example, one or more linear and/or rotational stages, a robotic arm, etc.

In contrast thereto, the reference antenna 16 is maintained in a fixed relationship to the device under test 12. This means that the reference antenna 16 is either moved simultaneously with the device under test 12, for example in the same manner, or rather 15 both the device under test 12 and the reference antenna 16 are maintained in their respective positions. Generally, this can be ensured by fixedly connecting the reference antenna 16 to the device under test 12 or to the holder 32 that holds the device under test 12.

For instance, the reference antenna 16 is used as a reference probe that is placed close to the device under test 12, namely in its proximity, to gather a complex radio frequency signal (RF signal) outputted by the device under test 12.

Further, the measurement antenna 14 relates to a measurement probe that may be moved on a sphere around the device under test 12, thereby sampling a radiated measurement signal, namely the RF signal outputted by the device under test 12 at a different location compared to the location of the reference antenna 16.

The reference signal and the measurement signal are further processed by the analyzer 16 as will be described hereinafter in more detail.

In any case, the analyzer 18 is capable of (e.g., includes circuitry configured for) determining a phase difference and a power ratio of the respective radio frequency signals received via the measurement antenna 14 and the reference antenna 16, namely a complex measurement signal provided by the measurement antenna 14 and a complex reference signal provided by the reference antenna 16. In some embodiments, the respective radio frequency signals are received by the respective antennas 14, 16 and forwarded to the analyzer 18 via the input ports 20 to 24.

Since the measurement antenna 14 is established by the dual-polarized measurement antenna, vertically-polarized ("V") and horizontally-polarized ("H") signal portions of the measurement signal can be processed independently of each other, as they are forwarded to the analyzer 18 separately for further processing.

For instance, the second input port 22 of the analyzer 18 is used for receiving the vertically-polarized signal portion, whereas the third input port 24 of the analyzer 18 is used for processing the horizontally-polarized signal portion of the measurement signal or vice versa.

Figure 2:
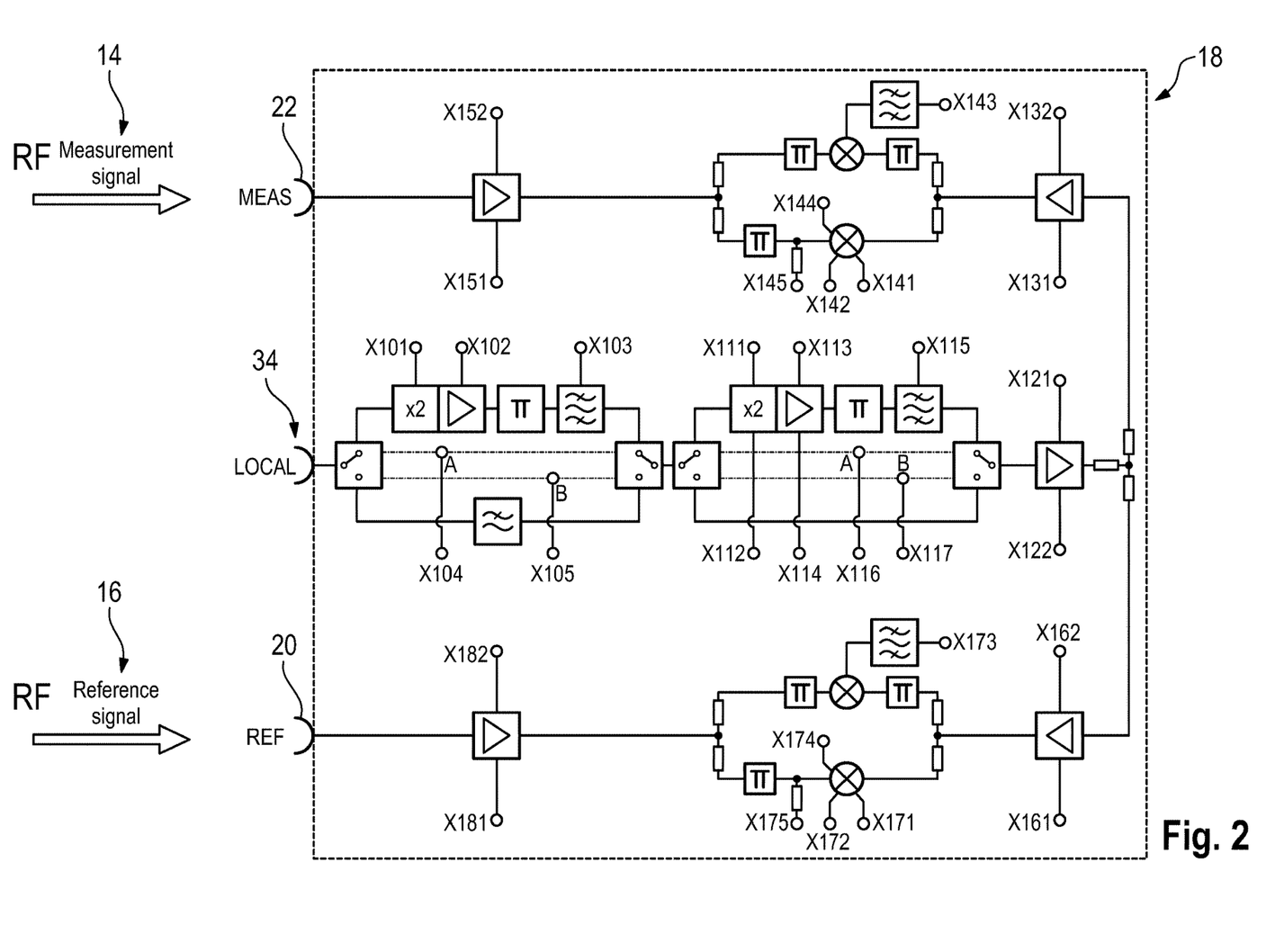
FIG. 2 schematically shows an overview of a part of the system according to an embodiment of the present disclosure, and FIG. 3 schematically shows an overview of a part of the system according to another embodiment of the present disclosure.

As shown in FIG. 2, the respective radio frequency signals received by the analyzer 18 may be digitized by the analyzer 18, e.g. by analog-to-digital converters (ADCs) integrated within the analyzer 18. In the embodiment shown in FIG. 2, the measurement antenna 14 only provides a measurement signal rather than the differently polarized signal portions such that the analyzer 18 receives two radio frequency signals, namely the radio frequency reference signal and the radio frequency measurement signal provided by the antennas 14, 16 respectively.

In addition, the analyzer 18 may comprise a local oscillator 34 that provides a local oscillator signal for further processing the RF measurement signal and the RF reference signal respectively.

In some embodiments, the analyzer 18 may compute a fast Fourier transformation based on the digitized signals, for example digitized intermediate frequency (IF) signals. For this purpose, the analyzer 18 may have a processing circuit 36 as shown in FIG. 1.

Then, Fourier transformations of the respective complex RF signals are obtained, wherein the respective resultants thereof may be divided by the processing circuit 36 in order to obtain a quotient of the transforms, which corresponds to a complex transfer function between the respective complex radio frequency signals gathered by the respective antennas 14, 16, namely the complex reference signal and the complex measurement signal obtained.

By using the complex transfer function between the respective complex radio frequency signals, the transfer function between the device under test 12 located in proximity to the reference antenna 16 and the measurement antenna 14 can be derived which is moved around the device under test 12 during the testing.

As mentioned above, the respective embodiment shown In FIG. 2 ensures coherent processing of the respective complex radio frequency signals such that the analyzer 18 is capable of performing an IQ analysis on the complex radio frequency signals, namely a coherent IQ analysis.

Figure 3:
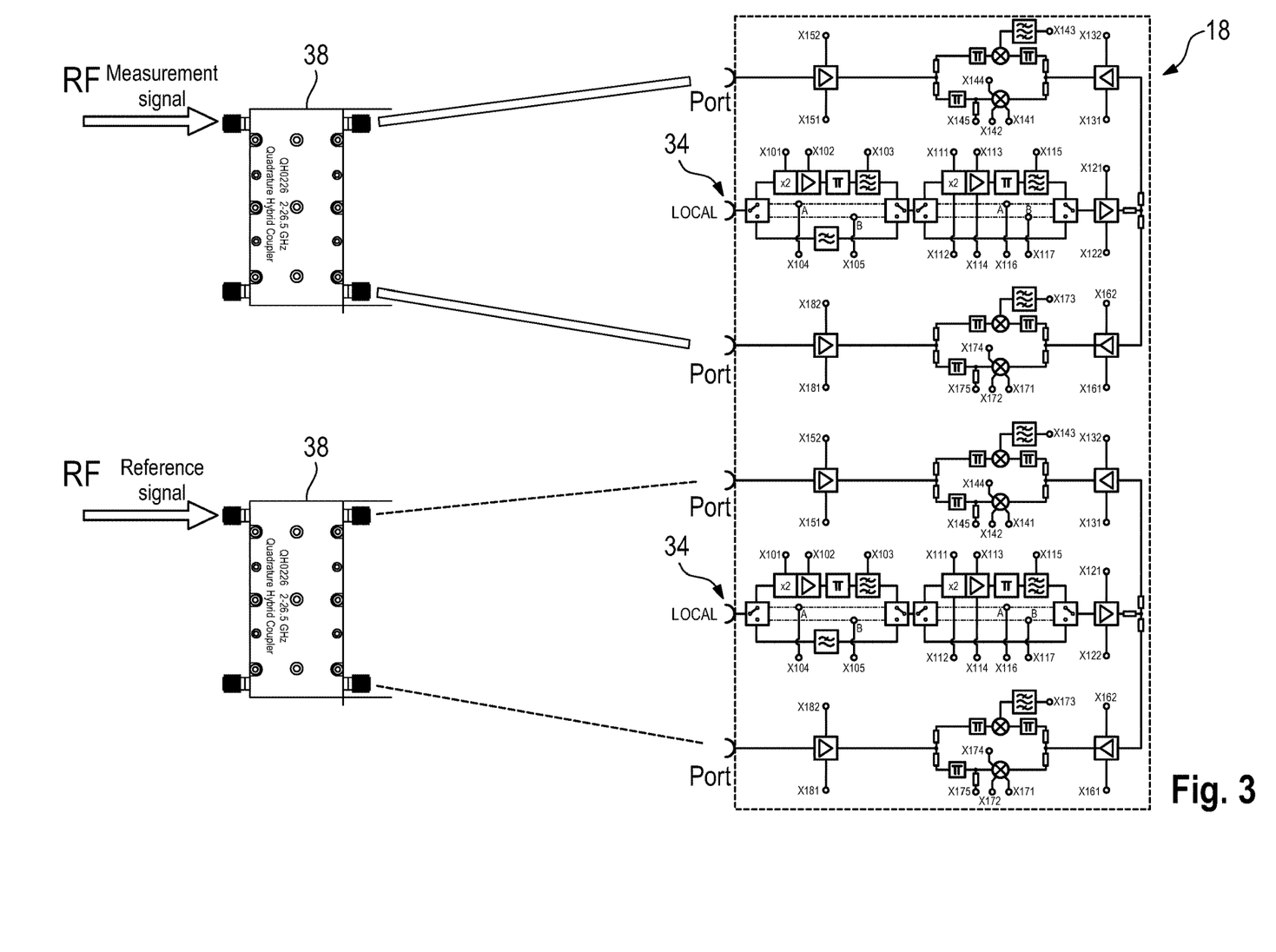

In an alternative embodiment shown in FIG. 3, the system 10 further comprises external hybrid couplers 38 that are associated with the respective ports of the analyzer 18 in order to split the respective radio frequency signals outputted by the respective antennas 14, 16 into first and second signals.

In some embodiments, one of the hybrid couplers 38 is associated with the measurement antenna 14 such that this hybrid coupler 28 is capable of splitting the radio frequency measurement signal outputted by the measurement antenna 14 into a first measurement signal and a second measurement signal, which are 90° phase shifted with respect to each other.

In some embodiments, the hybrid couplers 38 split and introduce the respective phase shift so as to obtain the 90° phase shifted signals.

The analyzer 18 is generally capable of (e.g., includes circuitry configured for) processing the first measurement signal and the second measurement signal, wherein both measurement signals may be combined with each other in intermediate frequency section (IF section), thereby obtaining a complex measurement signal that can be further processed by the analyzer 18.

In a similar manner, a second hybrid coupler 38 may be associated with the reference antenna 16, thereby ensuring that the radio frequency reference signal outputted by the reference antenna 16 is split into a first reference signal and a second reference signal. The analyzer 18 processes the respective first reference signal and the second reference signal further, wherein the respective reference signals are combined in IF section with each other in order to obtain a complex reference signal for further processing.

As shown in FIG. 3, two local oscillators 34 may be provided that are operated such that phase coherence is obtained.

In FIG. 1, a further alternative is shown since the respective hybrid couplers 38 are integrated in the analyzer 18 such that the respective signals are split internally by the analyzer 18. Hence, each port 20 to 24 is connected with a dedicated hybrid coupler 38 that splits the respective radio frequency signal received into at least two RF signals, namely the radio frequency reference signal, the vertically-polarized signal portion of the radio frequency measurement signal and horizontally-polarized signal portion of the radio frequency measurement signal which are received via ports 20, 22, 24 of the analyzer 18.

As further shown in FIG. 3, each hybrid coupler 38 is connected to two receivers 40 that receive and further process the respective RF signals received, e.g. digitize the phase-shifted RF signals associated with corresponding ports 20 to 24 of the analyzer 18.

In general, the input ports 20 to 24 of the analyzer 18 are associated with two receivers 40 each which can be used for performing the IQ analysis on the complex radio frequency signals due to the specific steps performed as outlined above. Therefore, the analyzer 18 is enabled to perform (complex) IQ analysis on the radio frequency signals even though the analyzer 18 is free of IQ mixer. The analyzer 18 is further configured to combine the phase-shifted RF signals, thereby obtaining a complex reference signal and a complex measurement signal, e.g. the digitized complex reference signal and the digitized complex measurement signal.

Accordingly, the analyzer 18 is capable of obtaining a complex reference signal and a complex measurement signal based on the radio frequency signals received via the measurement antenna 14 and the reference antenna 16 respectively.

In general, the analyzer 18 is configured to perform Fourier transformations of the (digitized) complex reference signal and the (digitized) complex measurement signal. In some embodiments, the analyzer 18 performs Fourier transformations of the complex RF reference signal and the complex RF measurement signal respectively.

Furthermore, the analyzer 18 is configured to divide the resultants of the respective Fourier transformations, thereby obtaining a quotient of the Fourier transformations, which corresponds to a complex transfer function between the radio frequency signal received via the reference antenna 16 and the radio frequency signal received via the measurement antenna 14.

In some embodiments, the analyzer 18 is a vector network analyzer or a broad-band direction finder.

Generally, the analyzer 18, e.g. the vector network analyzer, may generate arbitrary LO frequencies coherently. The analyzer 18 provides raw ADC data after digitizing the respective input signals, for example before applying a digital filter on the raw ADC data. Phase coherent measurements can be performed by dividing the respective signals received via the ports associated with the ADCs and further processing the split signals.

In some embodiments, one input port of the analyzer 18, e.g. the first port 20, is used for the RF reference signal provided by the reference antenna 16, also called primary signal, whereas two other input ports, e.g. input port 22 and input port 24, are used for the RF measurement signal, namely the differently polarized signal portions of the measurement signal respectively.

The analyzer 18, e.g. the vector network analyzer, does not have a dedicated IQ mixer. Hence, each signal to be processed further is divided with hybrid couplers 38, also called power dividers. This can be done internally after the respective signals have been inputted to the analyzer 18 as shown in FIG. 1. Alternatively, the signals are divided prior to inputting the divided ones into the analyzer 18 as shown in FIG. 3. Afterwards, these divided signals are sent to the respective ports 20, 22, 24 of the analyzer 18.

As shown in FIG. 1, each port 20 to 24 is associated with two receivers 40 that can be used as IQ receivers so as to enable the analyzer 18 to perform (coherent) IQ analysis even though the analyzer 18 does not have an IQ mixer. Moreover, ADC samples are obtained in a coherent manner from two (or more) receivers 40. Then, Fast Fourier Transformations are done for each signal provided by the receivers 40, for example the complex signals that correspond to the 90° phase shifted signals obtained when processing the RF signals by the hybrid couplers 38. Afterwards, cross correlations of the respective spectrums may be taken in order to obtain the transfer function that may be optionally filtered.

The respective IQ functionality of the analyzer 18 is obtained since each signal is divided and processed by two receivers 40 simultaneously. Hence, a complex network analysis of the device under test 12 is possible by using a vector network analyzer or rather a broad-band direction finder.

Certain embodiments disclosed herein utilize circuitry (e.g., one or more circuits), such as the analyzer, the processing circuit, etc., in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

In some embodiments, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality described herein.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also, in this regard, the present application may use the term "plurality" to reference a quantity or number. In this regard, the term "plurality" is meant to be any number that is more than one, for example, two, three, four, five, etc. The term "about," "approximately," etc., means plus or minus 5% of the stated value.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure, which are intended to be protected, are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure as claimed.

The embodiments of the invention in which an exclusive property or privilege is claimed are defined as follows:

1. A system for over-the-air testing of a device under test, the system comprising:
    a measurement antenna, a reference antenna, a device under test capable of wirelessly transmitting and/or receiving complex radio frequency signals, and an analyzer, wherein the analyzer has at least two ports, wherein the reference antenna is connected with a first port of the analyzer, wherein the measurement antenna is connected with a second port of the analyzer, wherein the analyzer is configured to determine a phase difference and a power ratio of the complex radio frequency signals received via the measurement antenna and the reference antenna, and wherein the analyzer is configured to perform an in-phase and quadrature (IQ) analysis on the complex radio frequency signals.

2. The system according to claim 1, wherein the analyzer is configured to perform a coherent IQ analysis.

3. The system according to claim 2, wherein the analyzer is configured to determine the phase difference and the power ratio based on the coherent IQ analysis.

4. The system according to claim 1, wherein the system is configured to split a radio frequency reference signal outputted by the reference antenna into a first reference signal and a second reference signal which are 90° phase shifted with respect to each other, and wherein the analyzer is configured to process the first reference signal and the second reference signal.

5. The system according to claim 4, wherein the analyzer is configured to combine the first reference signal and the second reference signal in an intermediate frequency section, thereby obtaining a complex reference signal.

6. The system according to claim 5, wherein the analyzer is configured to perform a Fourier transformation of the complex reference signal.

7. The system according to claim 4, further comprising a hybrid coupler that is configured to split the radio frequency reference signal outputted by the reference antenna into the first reference signal and the second reference signal.

8. The system according to claim 1, wherein the system is configured to split a radio frequency measurement signal outputted by the measurement antenna into a first measurement signal and a second measurement signal which are 90° phase shifted with respect to each other, and wherein the analyzer is configured to process the first measurement signal and the second measurement signal.

9. The system according to claim 8, wherein the analyzer is configured to comb the first measurement signal and the second measurement signal in an intermediate frequency section, thereby obtaining a complex measurement signal.

10. The system according to claim 9, wherein the analyzer is configured to perform a Fourier transformation of the complex measurement signal.

11. The system according to claim 8, wherein the system comprises a hybrid coupler that is configured to split the radio frequency reference signal outputted by the measurement antenna into the first measurement signal and the second measurement signal.

12. The system according to claim 1, wherein the analyzer is configured to obtain a complex reference signal and a complex measurement signal based on the radio frequency signals received via the measurement antenna and the reference antenna respectively, wherein Fourier transformations are performed of the complex reference signal and the complex measurement signal respectively, and wherein the analyzer is configured to divide resultants of the respective Fourier transformations, thereby obtaining a quotient of the resultants of the Fourier transformations.

13. The system according to claim 12, wherein the quotient corresponds to a complex transfer function between the radio frequency signal received via the reference antenna and the radio frequency signal received via the measurement antenna.

14. The system according to claim 1, wherein the measurement antenna is a dual-polarized measurement antenna having two output ports.

15. The system according to claim 14, wherein the analyzer has at least three ports, and wherein the dual-polarized measurement antenna is connected via its two output ports with the second port and a third port of the analyzer.

16. The system according to claim 1, wherein the reference antenna is positioned in a fixed relationship to the device under test.

17. The system according to claim 1, wherein the system comprises a positioner for relative positioning the measurement antenna and the device under test with respect to each other.

18. The system according to claim 1, wherein the ports of the vector network analyzer are associated with two receivers.

19. The system according to claim 1, wherein the analyzer is a vector network analyzer or a broad-band direction finder.

20. A method of over-the-air testing of a device under test, comprising the following steps:
   providing a device under test;
   receiving a radio frequency signal of the device under test by a measurement antenna that outputs a radio frequency measurement signal;
   receiving a radio frequency signal of the device under test by a reference antenna that outputs a radio frequency reference signal;
   forwarding the radio frequency measurement signal and the radio frequency reference signal to an analyzer;
   processing the radio frequency measurement signal and the radio frequency reference signal by the analyzer, thereby obtaining a complex reference signal and a complex measurement signal based on the radio frequency signals received;
   performing a Fourier transformation of the complex reference signal and a Fourier transformation of the complex measurement signal, thereby obtaining resultants of the respective Fourier transformations; and
   dividing the resultants of the respective Fourier transformations, thereby obtaining a quotient of the resultants of the Fourier transformations.

\* \* \* \* \*